US006433640B1

(12) United States Patent
Pavio et al.

(10) Patent No.: US 6,433,640 B1
(45) Date of Patent: Aug. 13, 2002

(54) METHODS AND APPARATUS FOR AMPLIFYING A TELECOMMUNICATION SIGNAL

(75) Inventors: Anthony M. Pavio, Paradise Valley; Lei Zhao, Chandler, both of AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/865,266

(22) Filed: May 25, 2001

(51) Int. Cl.$^7$ .............................................. H03F 3/68
(52) U.S. Cl. ..................... 330/295; 330/285; 330/286; 330/51
(58) Field of Search ................ 330/285, 286, 330/295, 51, 136, 134

(56) References Cited

U.S. PATENT DOCUMENTS

| | | | |
|---|---|---|---|
| 5,012,203 A | 4/1991 | Beyer et al. | 330/286 |
| 5,365,197 A | 11/1994 | Ikalainen | 330/286 |
| 5,432,473 A | * 7/1995 | Mattila et al. | 330/133 |
| 5,559,472 A | 9/1996 | Kobayashi | 330/293 |
| 5,880,640 A | 3/1999 | Dueme | 330/303 |
| 5,920,230 A | 7/1999 | Beall | 330/54 |
| 5,923,215 A | * 7/1999 | Hans | 330/149 |
| 6,130,579 A | * 10/2000 | Iyer et al. | 330/285 |
| 6,377,125 B1 | * 4/2002 | Pavio et al. | 330/286 |

\* cited by examiner

*Primary Examiner*—Robert Pascal
*Assistant Examiner*—Henry Choe
(74) *Attorney, Agent, or Firm*—William E. Koch

(57) ABSTRACT

Methods and apparatus (40) of amplifying a telecommunication signal (41) are provided in accordance with the present invention. The apparatus (40) comprises an input transmission line (48) configured to receive the telecommunication signal (41), an output transmission line (50) configured to provide an amplified output of the telecommunication signal (41) and N amplifier sections (42, 44, 45, 46) having a transistor (52) connected to the input transmission line (48) and the output transmission line (50). The apparatus (40) further comprises a waveform controller (84) connected to the transistor 52 and also configured to identify a signal level of the telecommunication signal 41. The waveform controller 84 is further configured to generate an independent biasing voltage for the transistor 52 such that the at least one of the N amplifier sections (42, 44, 45, 46) is configured for active operation and non-active operation based at least in part upon an evaluation of the signal level and an output power of the apparatus is reduced without a substantial degradation in an efficiency of the apparatus.

26 Claims, 3 Drawing Sheets

METHODS AND APPARATUS FOR AMPLIFYING A TELECOMMUNICATION SIGNAL

FIELD OF THE INVENTION

The present invention generally relates to amplifiers, and more particularly to methods and apparatus for amplifying a telecommunication signal.

BACKGROUND OF THE INVENTION

Distributed amplifiers and mixers have been used extensively for many years in a variety of broadband system applications such as microwave receivers, wide-band transmitter exciters and low noise oscilloscope preamplifiers. Distributed amplifiers are conventionally configured to employ multiple amplifier cells within the distributed transmission line networks. The conventional configuration of multiple amplifier cells within distributed transmission line networks generally exhibits the desired increase in gain. However, the efficiency of the conventional configuration of multiple amplifier cells within the distributed transmission line networks degrades with a reduction in drive power.

Referring to FIG. 1, a distributed amplifier 10 is illustrated according to the prior art. The distributed amplifier 10 is shown with multiple cells (12, 14, 16). Each of the cells (12, 14, 16) includes a field effect transistor (FET) 18. The drain terminal 20 of the FET 18 of each of the cells (12, 14, 16) are coupled with output-line inductances 22, which are connected to an output-line ground 24 with an output-line termination resistance 26. The gate terminals 28 of the first FET 18 of each of the cells (12, 14, 16) are coupled with input-line inductances 30 that are connected to an input-line ground 32 with an input-line termination resistance 34.

The distributed amplifier 10 of the prior art as illustrated in FIG. 1 has a lower output with a reduction in the drive power. However, the Direct Current (DC) power consumption is not substantially reduced so that the Power-Added Efficiency (PAE) of the distributed amplifier 10 of the prior art degrades as a function of the output power ($P_{out}$) An example of PAE degradation as a function of the output power ($P_{out}$) for a distributed amplifier of the prior art is illustrated in the graph of FIG. 2.

This PAE degradation as a function of output power ($P_{out}$) is especially evident when the distributed amplifier 10 of the prior art is utilized to amplify a telecommunication signal, such as a Code Division Multiple Access (CDMA) signal, a Time Division Multiple Access (TDMA) signal and a Global System for Multiple access (GSM) signal. This PAE degradation as a function of output power ($P_{out}$) in amplifying a telecommunication signal is at least partially due to the sizing of the distributed amplifier for peak power. Since the distributed amplifier is sized for peak power but operates predominantly at the average power level of the telecommunication signal, a typical distributed amplifier configured for amplification of the telecommunication signal exhibits less than desirable PAE.

In view of the foregoing, it should be appreciated that it would be desirable to provide methods and apparatus for amplifying a telecommunication signal with the apparatus and methods providing a PAE that is not substantially affected by a reduction in the drive power. Furthermore, additional desirable features will become apparent to one skilled in the art from the drawings, foregoing background of the invention and following detailed description of a preferred exemplary embodiment, and appended claims.

BRIEF DESCRIPTION OF THE DRAWINGS

The present invention will hereinafter be described in conjunction with the appended drawing figures, wherein like numerals denote like elements, and.

DETAILED DESCRIPTION OF A PREFERRED EXEMPLARY EMBODIMENT

The following detailed description of a preferred embodiment is merely exemplary in nature and is not intended to limit the invention or the application and uses of the invention.

Figure 1:
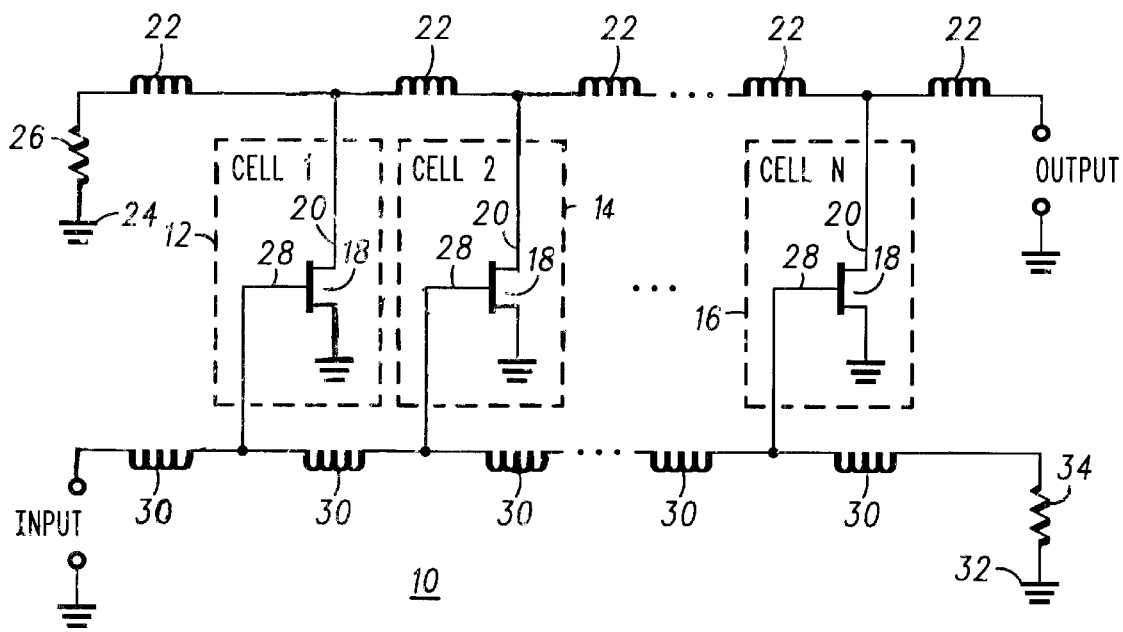
FIG. 1 is a schematic circuit diagram of a distributed amplifier according to the prior art.
Figure 2:
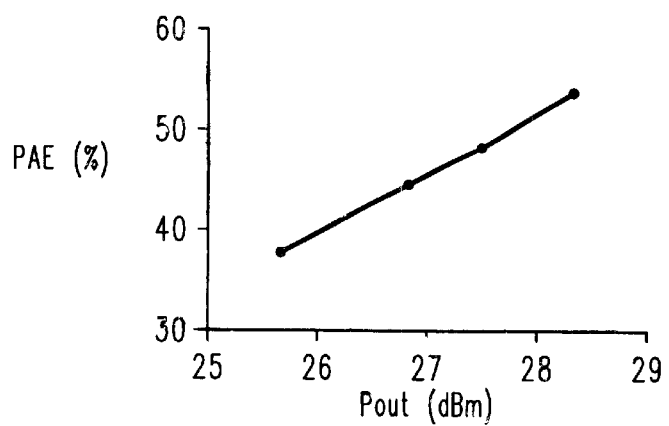
FIG. 2 is a graph illustrating the Power-Added Efficiency (PAE) degradation as a function of the output power (Pout) for a distributed amplifier of the prior art.
Figure 3:
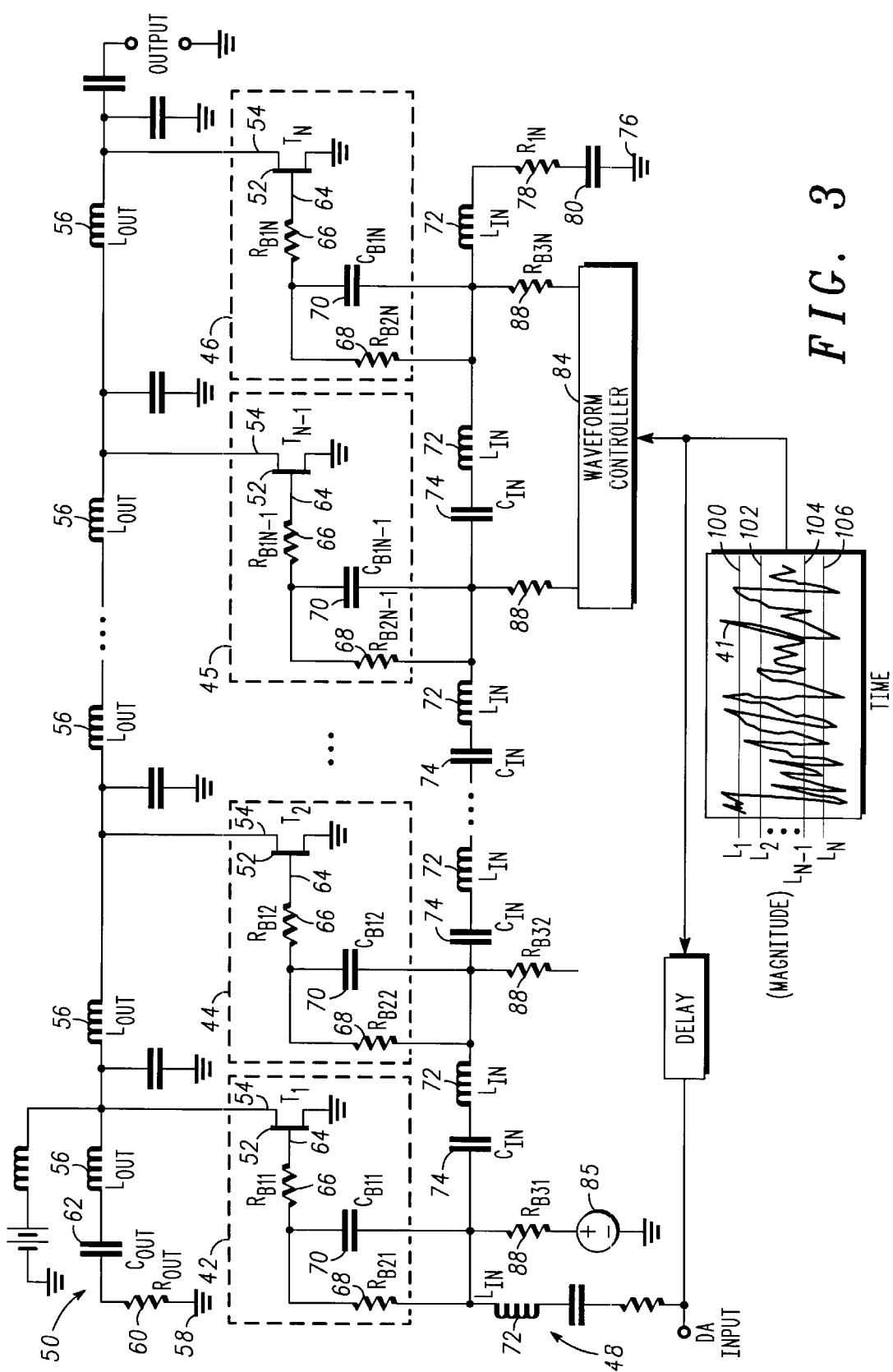
FIG. 3 is an apparatus for amplifying a telecommunication signal according to a preferred exemplary embodiment of the present invention.

Referring to FIG. 3, an apparatus 40 is illustrated for amplifying a telecommunication signal 41 according to a preferred exemplary embodiment of the present invention. The apparatus 40 is comprised of an input transmission line 48 that is configured to receive the telecommunication signal 41, an output transmission line 50 that is configured to provide an amplified output of the telecommunication signal 41 received at the input transmission line 48, and N amplifier sections (42, 44, 45, 46) having a transistor 52 connected to the input transmission line 48 and the output transmission line 50. The apparatus 40 is further comprised of a waveform controller 84 that is connected to the transistor 52 of at least one of the N amplifier sections (42, 44, 45, 46) and configured to identify a signal level of the telecommunication signal 41. The waveform controller 84 is further configured to generate an independent biasing voltage for the transistor 52 of the at least one of the N amplifier sections (42, 44, 45, 46) such that the at least one of the N amplifier sections (42, 44, 45, 46) is configured for active operation and non-active operation based at least in part upon an evaluation of the signal level and an output power of the apparatus 40 is reduced without a substantial degradation in an efficiency of the apparatus 40.

Figure 4:
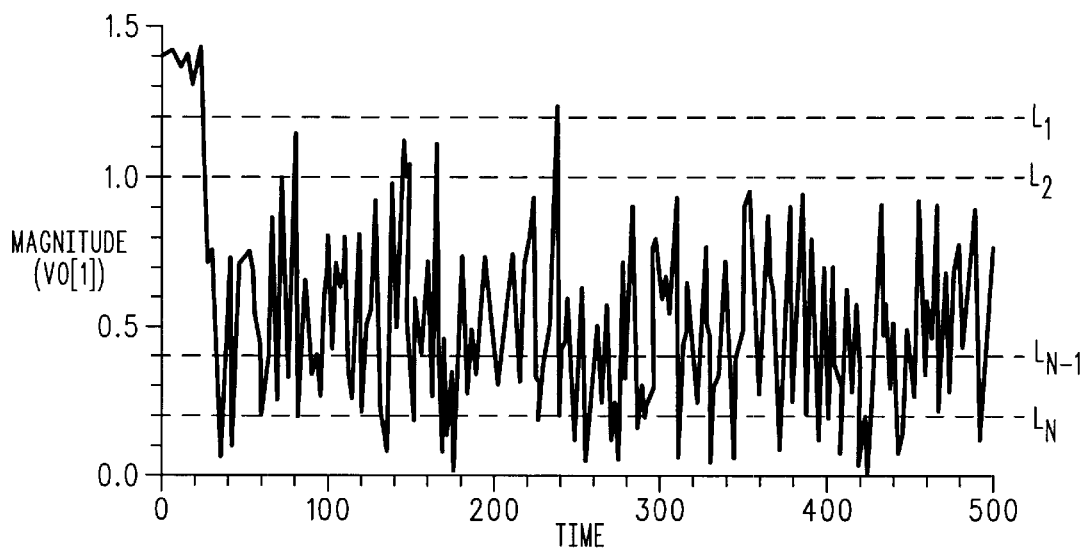
FIG. 4 is an enlarged view of an example of the telecommunication signal and the predetermined levels of FIG. 3.

The apparatus 40 can be configured to amplify any number of telecommunication signals. For example, the apparatus 40 can be configured to amplify a Time Division Multiple Access (TDMA) signal, a Global System for Multiple (GSM) access signal, and/or a Code Division Multiple Access (CDMA) signal. An enlarged view of an example of the telecommunication signal 41 is shown in FIG. 4, which includes the predetermined levels ($L_1$, $L_2$, $L_{N-1}$, $L_N$) (100, 102, 104, 106) to be subsequently discussed in this detailed description of a preferred exemplary embodiment. However, any number of telecommunication signals can be amplified with the methods and apparatus of the present invention. In addition, the apparatus 40 can be configured to have N amplifier sections (42, 44, 45, 46) with N an integer preferably greater than one, more preferably greater than two, even more preferably greater than three, and most preferably greater than three and less than seven (i.e., N is most preferably four to six).

As previously provided in this detailed description of a preferred exemplary embodiment, the N amplifier cells (42, 44, 46) include a transistor ($T_1$, $T_2$, ..., $T_{N-1}$, $T_N$) 52 connected between the input transmission line 48 and the output transmission line 50. The transistor 52 is preferably a Junction Field Effect Transistor (JFET), more preferably a High Electron Mobility Transistor (HEMT) and most preferably Pseudomorphic High Electron Mobility Transistor (PHEMT). However, any number of transistor types can be used for the transistor 52 of one or more of the N amplifier cells (42,44,45,46) in accordance with the present invention, such as a Bipolar Junction Transistor (BJT) and/or a Metal-Oxide Semiconductor Field Effect Transistor (MOSFET). Furthermore, while the following detailed description of a preferred exemplary embodiment will describe with a single transistor configuration for the N amplifier cells (42, 44, 45, 46), any number of transistors in any number of amplifier cell configurations can be used, including, but not limited to multiple transistors in a cascode configuration.

Figure 5:
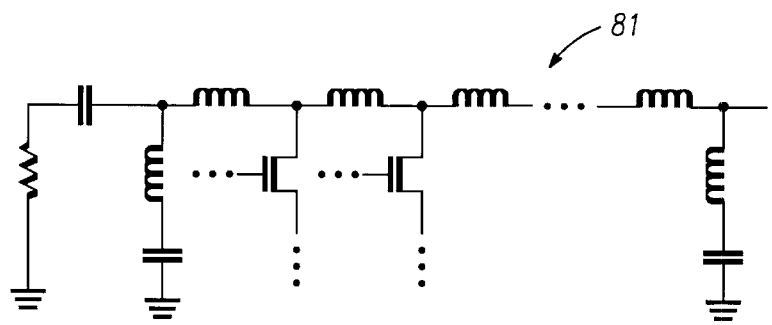
FIG. 5 is a constant-K with M derived half-sections configuration of the input transmission line and/or the output transmission line of FIG. 3.
Figure 6:
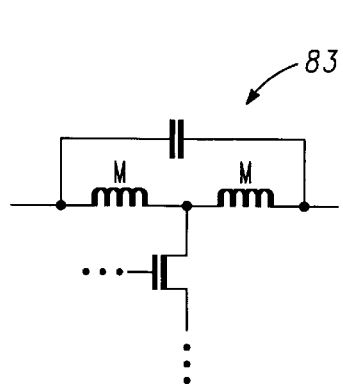
FIG. 6 is a constant-R configuration of the input transmission line and/or the output transmission line of FIG. 3.

In accordance with the preferred exemplary embodiment of the present invention, the drain terminal 54 of the transistor 52 of the N amplifier cells (42, 44, 45, 46) is coupled with output-line inductances ($L_{out}$) 56, which are connected to an output-line ground 58 with an output-line termination resistance ($R_{out}$) 60 and an output-line capacitance ($C_{out}$) 62. The gate terminal 64 of the transistor 52 of the N amplifier cells (42, 44, 45, 46) is connected to the input transmission line 48 formed of input-line inductances ($L_{in}$) 72 and input-line capacitances ($C_{in}$) 74 that are connected to an input-line ground 76 with an input-line termination resistance ($R_{in}$) 78 and an input-line termination capacitor 80 ($C_{in}$). However, the gate terminal 64 and drain terminal 54 of the transistor 52 of the N amplifier cells (42, 44, 45, 46) can be connected to the input transmission line 48 and output transmission line 50 formed in any number of electrical configurations. For example, a constant-R 83 and/or a constant-K with M-derived half sections 81 can be utilized in accordance with the present invention as shown in FIG. 5 and FIG. 6, respectively.

The gate terminal 64 of the transistor 52 of the N amplifier cells (42, 44, 45, 46) is connected to the input transmission line 48 with a biasing network having a first stability resistor ($RB_{11}$, $RB_{12}$, ..., $R_{B1(N-1)}$, $R_{B1N}$) 66 in series with a second biasing resistor ($R_{B21}$, $R_{B22}$, ..., $R_{B2(N-1)}$, $R_{B2N}$) 68 in parallel with a first biasing capacitor ($C_{B11}$, $C_{B12}$, ..., $C_{B1(N-1)}$, $C_{B1N}$) 70, and each of the biasing networks of the N cells (42, 44, 45, 46) is connected with a third biasing resistor ($R_{B31}$, $R_{B32}$, ..., $R_{B3(N-1)}$, $R_{B3N}$) 88 to a biasing source, with the waveform controller 84 configured as the biasing source for at least one of the N amplifier cells (42, 44, 45, 46) and more preferably configured as the biasing source for more than one of the N amplifier cells (44, 45, 46) as shown in FIG. 3. However, one or more voltage sources can also be connected to the third biasing resistor ($R_{B31}$, $R_{B32}$, ..., $R_{B3N}$) 88 and configured as the biasing source for one or more of the N amplifier cells (42, 44, 45, 46). For example, a voltage source can be configured to provide an average signal bias to the first cell 42 of the N amplifier cells (42, 44, 45, 46) as shown in FIG. 3.

The biasing of the transistor 52 for one or more of the N cells (44, 45, 46) by the waveform controller 84 is based at least in part upon an evaluation of the signal level of the telecommunication signal 41 received by the waveform controller 84. The signal level can be any number of characteristics of the telecommunication signal 41, including, but not limited to an instantaneous magnitude, instantaneous peak power, average magnitude or average peak power of the telecommunication signal 41. Depending on the results of the evaluation of the signal level by the waveform controller 84, the waveform controller 84 independently and sequentially applies a bias voltage to one or more of the N amplifier cells (42, 44, 45, 46). Preferably, the waveform controller 84 independently and sequentially applies a pinch-off voltage ($V_p$) (i.e., the voltage at which the current flow between the drain and the source is reduced essentially to zero) to a predetermined number of the transistors 52 such that the predetermined number of the N amplifier cells (42, 44, 45, 46) is configured for a non-active operating region (i.e., which is also referred to as the nonsaturated region, triode region, or ohmic region, and the transistor is not biased for use as an amplifier) in an order beginning with the $N^{th}$ amplifier cell (46) while maintaining a sufficient number of the N amplifier cells in the active region to provide proper amplification of the telecommunication signal 41.

The evaluation of the signal level by the waveform controller is preferably a comparison between the signal level and predetermined levels ($L_1$, $L_2$, $L_{N-1}$, $L_N$) (100, 102, 104, 106). For example, the comparison between the signal level and the predetermined levels ($L_1$, $L_2$, $L_{N-1}$, $L_N$) (100, 102, 104, 106) can be a comparison between the magnitude of the telecommunication signal 41 and the predetermined levels ($L_1$, $L_2$, $L_{N-1}$, $L_N$) (100, 102, 104, 106) that are magnitude levels of increasing magnitude (i.e., $L_1 > L_2 > \ldots > L_{N-1} > L_N$). The relationship between the magnitude of the telecommunication signal 41 and each of the predetermined levels ($L_1$, $L_2$, $L_{N-1}$, $L_N$) (100, 102, 104, 106) determines the number of the N amplifier cells (42, 44, 45, 46) that are configured for active operating region in order to amplify the telecommunication signal 41 without substantial degradation in the PAE of the apparatus 40.

For example, if the signal magnitude of the telecommunication signal is determined to be at least equal to the first predetermined level (L1) 100 that is a peak magnitude level, the waveform controller 84 can be configured to bias all of the N amplifier cells (42, 44, 45, 46) for active region operation (i.e., each transistor 52 is biased for use as an amplifier). However, if the signal level is below the first predetermined level 100 and at least equal to the second predetermined level 102, then the Nth amplifier cell 46 is biased by the waveform controller 84 for non-active operation while the other N amplifier cells (44, 45) under the control of the waveform controller are biased for active operation. Furthermore, if the signal level is below the second predetermined level 102, then the $N^{th}$ amplifier cell 46 and the N–1 amplifier cell 45 are preferably biased by the waveform controller 84 for non-active operation while the other amplifier cells (44) under the control of the waveform controller 84 are biased for active operation, and so forth. This allows the output power of the apparatus to be reduced without substantially degrading the PAE of the apparatus 40.

The evaluation by the waveform controller 84 is preferably accomplished with instructions provided by software or firmware, which is executed by a microprocessor or microcontroller of the waveform controller 84. In order to allow the waveform controller 84 sufficient time to evaluate the telecommunication signal 41, the telecommunication signal 41 is preferably delayed with a delay device 108 prior to presentation of the telecommunication signal 41 at the input 110 of the apparatus 40 for amplification by the apparatus 40. The delay time (T) provided by the delay device 110 is preferably a sufficient amount of time for the waveform controller 84 to process the telecommunication signal 41 and apply the appropriate bias or biases to the N amplifier cells (44, 45, 46) under the control of the waveform controller 40. Therefore, the delay time (T) is hardware and application specific.

Figure 7:
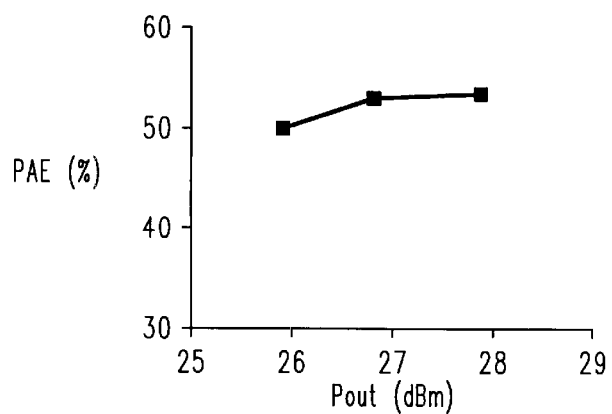
FIG. 7 is a graph illustrating the PAE as a function of the output power for the apparatus of FIG. 3 that is operated according to the method of FIG. 7 according to a preferred exemplary embodiment of the present invention.

As can be appreciated by one of ordinary skill in the art, the apparatus 40 reduces the output power to a predetermined level based at least in part upon an evaluation of the signal level. The reduction in output power is preferably configured to be proportional to the number of amplifier cells that are configured for non-active operation (e.g., reduction in the output power is preferably configured to be M/N, where M is the number of amplifier cells configured for non-active operation). Furthermore, the degradation in the PAE of the apparatus 40 is preferably less than about a twenty percent, more preferably less than about a fifteen percent, even more preferably less than a ten percent, and most preferably less than about a five percent reduction in the PAE from the maximum PAE corresponding to the maximum output power. An example of PAE degradation as a function of the output power ($P_{out}$) is shown in FIG. 7 for the apparatus 40.

From the foregoing description, it should be appreciated that methods and apparatus are provided for amplifying a telecommunications signal that present significant benefits that have been presented in the background of the invention and detailed description of a preferred exemplary embodiment and also present significant benefits that would be apparent to one skilled in the art. Furthermore, while a preferred exemplary embodiment has been presented in the foregoing description of a preferred exemplary embodiment, it should be appreciated that a vast number of variations in the embodiments exist. Lastly, it should be appreciated that these embodiments are preferred exemplary embodiments only, and are not intended to limit the scope, applicability, or configuration of the invention in any way. Rather, the foregoing detailed description provides those skilled in the art with a convenient road map for implementing a preferred exemplary embodiment of the invention. It being understood that various changes may be made in the function and arrangement of elements described in the exemplary preferred embodiment without departing from the spirit and scope of the invention as set forth in the appended claims.

What is claimed is:

1. An apparatus for amplifying a telecommunication signal, comprising:
    an input transmission line configured to receive the telecommunication signal;
    an output transmission line configured to provide an amplified output of the telecommunication signal received at said input transmission line;
    a distributed amplifier comprising:
    N amplifier sections having a transistor connected to said input transmission line and said output transmission line;
    a waveform controller connected to said transistor of at least one of said N amplifier sections and configured to identify a signal level of the telecommunication signal, said waveform controller further configured to generate an independent biasing voltage for active operation and non-active operation of said transistor of said at least one of said N amplifier sections,
    wherein said waveform controller is configured to generate said independent biasing voltage such that said at least one of said N amplifier sections is configured for active operation and non-active operation based at least in part upon an evaluation of said signal level and an output power of the apparatus is reduced without a substantial degradation in an efficiency of the apparatus.

2. The distributed amplifier of claim 1, wherein said transistor of each of the N amplifier sections is a Junction Field Effect Transistor (FET).

3. The apparatus of claim 2, wherein N is an integer greater than one.

4. The apparatus of claim 2, wherein N is an integer greater than two.

5. The apparatus of claim 2, wherein N is an integer greater than three and less than seven.

6. The apparatus of claim 2, wherein said reduction in said output power of said distributed amplifier is inversely proportional to the N.

7. The apparatus of claim 2, wherein said substantial degradation in said efficiency of the distributed amplifier is less than about twenty percent.

8. The apparatus of claim 2, wherein said substantial degradation in said efficiency of the distributed amplifier is less than about fifteen percent.

9. The apparatus of claim 2, wherein said substantial degradation in said efficiency of the distributed amplifier is less than about ten percent.

10. The apparatus of claim 2, wherein said substantial degradation in said efficiency of the distributed amplifier is less than about five percent.

11. The apparatus of claim 2, wherein the communication signal is a Code Division Multiple Access (CDMA) communication signal.

12. The apparatus of claim 2, wherein the communication signal is a Time Division Multiple Access (TDMA) communication signal.

13. The apparatus of claim 2, wherein the communication signal is a Global System for Multiple (GSM) access communication signal.

14. A method of amplifying a telecommunication signal with a distributed amplifier having N amplifier sections connected to an input transmission line and an output transmission line, comprising:
    applying a first bias voltage to a transistor of at least one of the N amplifier sections of the distributed amplifier, connected to the input transmission line and the output transmission line for active region operation;
    evaluating a signal level of said telecommunication signal; and
    modifying said first bias voltage applied to said transistor of at least one of the N amplifier sections based at least in part upon said evaluating said signal level of said telecommunication signal such that said transistor of at least one of the N amplifier sections is configured for non-active operation and an output of the distributed amplifier is reduced without a substantial degradation in an efficiency of the distributed amplifier.

15. The method of claim 14, wherein said transistor of each of the N amplifier sections is a Junction Field Effect Transistor (FET).

16. The method of claim 14, wherein N is an integer greater than one.

17. The method of claim 14, wherein N is an integer greater than two.

18. The method of claim 14, wherein N is an integer greater than three and less than seven.

19. The method of claim 14, wherein said reduction in said output power of said distributed amplifier is inversely proportional to the N.

20. The method of claim 14, wherein said substantial degradation in said efficiency of the distributed amplifier is less than about twenty percent.

21. The method of claim 14, wherein said substantial degradation in said efficiency of the distributed amplifier is less than about fifteen percent.

22. The method of claim 14, wherein said substantial degradation in said efficiency of the distributed amplifier is less than about ten percent.

23. The method of claim 14, wherein said substantial degradation in said efficiency of the distributed amplifier is less than about five percent.

24. The method of claim 14, wherein the communication signal is a Code Division Multiple Access (CDMA) communication signal.

25. The method of claim 14, wherein the communication signal is a Time Division Multiple Access (TDMA) communication signal.

26. The method of claim 14, wherein the communication signal is a Global System for Multiple (GSM) access communication signal.

* * * * *